(12) United States Patent
Middendorf

(10) Patent No.: US 9,992,861 B2
(45) Date of Patent: Jun. 5, 2018

(54) HEAVY-WIRE BOND ARRANGEMENT AND METHOD FOR PRODUCING SAME

(75) Inventor: Andreas Middendorf, Kleinmachnow (DE)

(73) Assignee: Technische Universität Berlin (DE)

( * ) Notice: Subject to any disclaimer, the term of this patent is extended or adjusted under 35 U.S.C. 154(b) by 1080 days.

(21) Appl. No.: 13/878,787

(22) PCT Filed: Aug. 7, 2011

(86) PCT No.: PCT/DE2011/075214
§ 371 (c)(1),
(2), (4) Date: Apr. 11, 2013

(87) PCT Pub. No.: WO2012/062300
PCT Pub. Date: May 18, 2012

(65) Prior Publication Data
US 2013/0220673 A1   Aug. 29, 2013

(30) Foreign Application Priority Data

Oct. 12, 2010   (DE) ........................ 10 2010 038 130

(51) Int. Cl.
*H01L 29/40* (2006.01)
*H05K 1/02* (2006.01)
(Continued)

(52) U.S. Cl.
CPC ........... *H05K 1/0271* (2013.01); *H01L 24/43* (2013.01); *H01L 24/48* (2013.01); *H01L 24/85* (2013.01);
(Continued)

(58) Field of Classification Search
CPC ......... H01L 24/47; H01L 24/43; H01L 24/16; H01L 24/48; H01L 23/4952; H01L 24/85; H05K 3/32
See application file for complete search history.

(56) References Cited

U.S. PATENT DOCUMENTS

| 3,934,783 | A | | 1/1976 | Larrison | |
|---|---|---|---|---|---|
| 4,003,623 | A | * | 1/1977 | Reynolds | H01R 4/188 439/395 |
| 4,415,115 | A | * | 11/1983 | James | B23K 20/005 228/170 |
| 5,735,030 | A | * | 4/1998 | Orcutt | H01L 23/4952 174/536 |
| 5,746,701 | A | * | 5/1998 | Noone | A61M 25/09 600/585 |
| 2006/0027623 | A1 | * | 2/2006 | Yanagisawa | B23K 20/004 228/4.5 |

(Continued)

FOREIGN PATENT DOCUMENTS

| DE | 4031814 | 4/1992 |
|---|---|---|
| JP | 07302811 | 11/1995 |
| JP | 2006066704 | 3/2006 |

OTHER PUBLICATIONS

JP2010-199199 English translation.*
International Search Report; PCT/DE2011/075214; Int'l File Date: Sep. 7, 2011; Technische Universitaet Berlin; 3 pgs.

*Primary Examiner* — Steven T Sawyer
(74) *Attorney, Agent, or Firm* — Schmeiser, Olsen & Watts, LLP

(57) ABSTRACT

The invention relates to a heavy-wire bond arrangement, having a substrate (2), a heavy wire (1) and a high-voltage heavy-wire bond connection, in which an end bond section (4) of the heavy wire (1), which extends towards the end (7) of the heavy wire (1), is bonded to the substrate (2), such that in the area of the bond section (4) a bond contact (5) between the heavy wire (1) and the substrate (2) is formed, the heavy wire (1) having a tapering section (6) which adjoins the end of the wire (7) and in which the wire cross-section tapers towards the end of the wire (7). The application additionally relates to a method for producing a heavy-wire bond arrangement.

14 Claims, 1 Drawing Sheet

(51) Int. Cl.
*H01L 23/00* (2006.01)
*H05K 3/32* (2006.01)

(52) U.S. Cl.
CPC ............... *H05K 3/32* (2013.01); *H01L 24/45* (2013.01); *H01L 2224/43847* (2013.01); *H01L 2224/45015* (2013.01); *H01L 2224/45124* (2013.01); *H01L 2224/45144* (2013.01); *H01L 2224/4847* (2013.01); *H01L 2224/48247* (2013.01); *H01L 2224/48455* (2013.01); *H01L 2224/48456* (2013.01); *H01L 2224/48699* (2013.01); *H01L 2224/85939* (2013.01); *H01L 2224/85947* (2013.01); *H01L 2924/00014* (2013.01); *H01L 2924/01013* (2013.01); *H01L 2924/01014* (2013.01); *H01L 2924/01079* (2013.01); *H01L 2924/01082* (2013.01); *H01L 2924/10253* (2013.01); *H01L 2924/12041* (2013.01); *H01L 2924/12042* (2013.01); *H01L 2924/2076* (2013.01); *Y10T 29/4913* (2015.01)

(56) References Cited

U.S. PATENT DOCUMENTS

| | | | |
|---|---|---|---|
| 2006/0175383 A1* | 8/2006 | Mii | B23K 20/004 228/180.5 |
| 2006/0186554 A1* | 8/2006 | Otremba | H01L 23/4952 257/784 |
| 2006/0255101 A1* | 11/2006 | Shirato | B23K 20/004 228/180.5 |
| 2008/0185740 A1* | 8/2008 | Schloegel | H01L 24/05 257/784 |
| 2008/0197510 A1* | 8/2008 | Mii | B23K 20/004 257/780 |
| 2009/0302447 A1* | 12/2009 | Stumpf | H01L 24/85 257/685 |
| 2010/0200969 A1* | 8/2010 | Huang | H01L 24/45 257/666 |

* cited by examiner

HEAVY-WIRE BOND ARRANGEMENT AND METHOD FOR PRODUCING SAME

FIELD OF TECHNOLOGY

The following relates to a heavy-wire bond arrangement and a method for producing the same.

BACKGROUND

Wire bonding is one of the technologies used in the construction of electrical connections. Wire bonding is typically used for connecting a so-called die, in particular, for example, the semiconductors of an integrated semiconductor, a light emitting diode or a sensor, to electrical connections of a chip housing. The process of wire contacting is then known as wire bonding.

A distinction is made between the bonding of thin wires and heavy wires. While the thin wires, which often consist of pure gold or alloyed or doped gold, have wire thicknesses between approximately 25 µm and less than 100 µm, heavy-wire bonding covers heavy wires with diameters of between approximately 100 µm and approximately 500 µm. Such heavy wires are used to cope with high current loads, for example, in so-called power semiconductors.

In the field of heavy-wire bonding, the different thermal expansion coefficients of the materials involved, i.e. in particular of the semiconductor and the heavy wire, lead to fatigue cracks forming in the contacting plane of the heavy-wire bond connections. Therefore, there exists a need for technologies for preventing such problems in heavy-wire bond connections.

Document DE 4031 814 A1 relates to a power semiconductor package with an integrated power semiconductor, which is arranged on a substrate and can be connected to peripheral adjacent contact points via conductor connections.

SUMMARY

The object of the invention is to specify improved technologies in the field of heavy-wire bonding with which the likelihood of fatigue problems occurring in heavy-wire bond connections is reduced, or even completely eliminated.

This object is achieved according to the invention by a heavy-wire bond arrangement according to independent Claim 1 and a method for producing a heavy-wire bond arrangement according to independent Claim 10. Advantageous configurations of the invention are the subject matter of dependent secondary claims.

The invention comprises the idea of a heavy-wire bond arrangement with a substrate, a heavy wire and a high-voltage heavy-wire bond connection, in which an end bond section of the heavy wire, which extends towards the end of the heavy wire, is bonded to the substrate, such that in the area of the bond section a bond contact between the heavy wire and the substrate is formed, the heavy wire having a tapering section which adjoins the end of the wire and in which the wire cross-section tapers towards the end of the wire.

According to a further aspect of the invention, a method for producing a heavy-wire bond arrangement is provided, the method comprising the following steps: providing a substrate, providing a heavy-wire and forming a high-voltage heavy-wire bond connection, by bonding an end bond section of the heavy wire, which extends towards the end of the heavy wire, to the substrate, such that in the area of the bond section a bond contact between the heavy wire and the substrate is formed, wherein the heavy wire is formed with a tapering section which adjoins the end of the wire and in which the wire cross-section tapers towards the end of the wire.

The provision of the tapering section, which extends in the bond section of the heavy wire as far as the end of the wire, reduces the effective shear stress in the area of the bond section, resulting in an improved reliability of the bond connection between heavy wire and substrate. The likelihood of reduced fatigue cracks is reduced. The current-carrying capacity is maintained in the area of the bond section. The selectively modified geometry in the area of the tapering section guarantees, however, that a greater stability of the bond connection is obtained.

The substrate can optionally be provided with a surface coating, for example, a metallization. In this case, the heavy wire is bonded onto the metallization.

The contact surface formed between heavy wire and substrate in the area of the bond contact is also known as a landing pad.

Preferably, in one embodiment the tapering section starts in an area of full material thickness of the heavy wire. The wire cross-section preferably tapers continuously from the beginning of the tapering section, wherein the taper towards the end of the wire can be constant or non-constant. In particular, a constant taper is provided if the degree of decrease of the wire cross-section per unit length is equal over the entire tapering section. A non-constant taper then means that for at least a part of the section, this is simply not the case.

A preferred extension of the invention provides that the bond contact formed between the heavy wire and the substrate in the area of the bond section is continuous. This means that a continuous contact surface (landing pad) is formed in the area of the bond section between the substrate and the heavy wire. The bond contact then extends in particular to the end of the wire.

In an advantageous design of the invention it can be provided that the tapering section is formed in multiple stages, wherein tapering sections are formed with different degrees of taper. This embodiment corresponds to a non-constant taper in the area of the tapering section. For example, different degrees of taper correspond to steeper and flatter gradients, which decrease with different slopes towards the end of the wire. Alternatively, in the area of the tapering section the taper can be constant throughout.

An advantageous embodiment of the invention provides that in the tapering section, the wire cross-section tapers on at least two sides. In this embodiment, the wire cross-section of the heavy wire decreases on multiple sides. A decrease of the wire cross-section can also be provided in the area of the tapering section on all sides, with the exception of the surface section of the heavy wire, which is included in the bond contact.

One development of the invention preferably provides that the tapering section is designed with an essentially flat side face, declining from one side of the heavy wire. For example, the declining side face is produced as a covering surface on the top face of the heavy-wire. For example, such a taper can be produced by mechanical processing with a stamp, acting on the end of the heavy wire from above.

In one advantageous design of the invention, the tapering section can be made to taper off at the wire end to form a residual base section on the end face. In this design, the area of the wire end remains unchanged in spite of the tapering in the area of the tapering section. Alternatively, for this purpose it can be provided that the tapering extends as far as a tip of the wire. If the end-face base section remains, then this preferably has a height above the plane of the substrate of between approximately 20 and 40%, more preferably between 20% and 30%, of the wire thickness.

One extension of the invention can provide that the tapering section is formed with a notched taper. In this embodiment, notches can be incorporated in the area of the tapering section from the top side of the wire, i.e. the side facing away from the substrate, wherein the depth of these notches increases towards the end of the wire, so that a kind of effective tapering of the wire section is formed. In this or other designs the notches extend substantially perpendicular to, or at an angle to, the heavy wire in the area of the bond section. This then corresponds to a substantially perpendicular or oblique design in relation to the surface of the substrate facing the heavy wire. The angle between the longitudinal direction of the notches and the longitudinal direction of the wire can have a value of between 0 and 180 degrees.

A preferred extension of the invention provides that the tapering section at the wire end extends over a range of approximately 60% to 70% of the length of the bond section. The tapering section extends over this length beginning at the end of the wire.

In one advantageous design of the invention, the bond section can extend over a length which corresponds to a value of about 10% to 20% of the thickness of the heavy wire.

In connection with the method for producing a heavy-wire bond arrangement, the remarks made above in connection with advantageous designs of the heavy-wire bond arrangement apply correspondingly. In one design it can be provided that the tapering section with its tapering geometry is formed before the bonding of the bond section to the substrate. Alternatively, the tapering section can also be formed after the bonding. It can also be provided that the tapering section is formed in the process of bonding the bond section to the substrate.

The means by which the tapering section is produced can take various forms, for example, grinding, laser processing and/or cutting. The corresponding operation can easily be integrated into the processes of heavy-wire bonding known as such. In one design the tapering section can be produced by using a bonding tool, which otherwise typically acts substantially perpendicular to the bonded wire, with a modified cutting angle.

BRIEF DESCRIPTION OF THE DRAWINGS

The invention is described in greater detail in the following, with the aid of exemplary embodiments and by reference to the figures of a drawing. These show.

DETAILED DESCRIPTION

Figure 1:
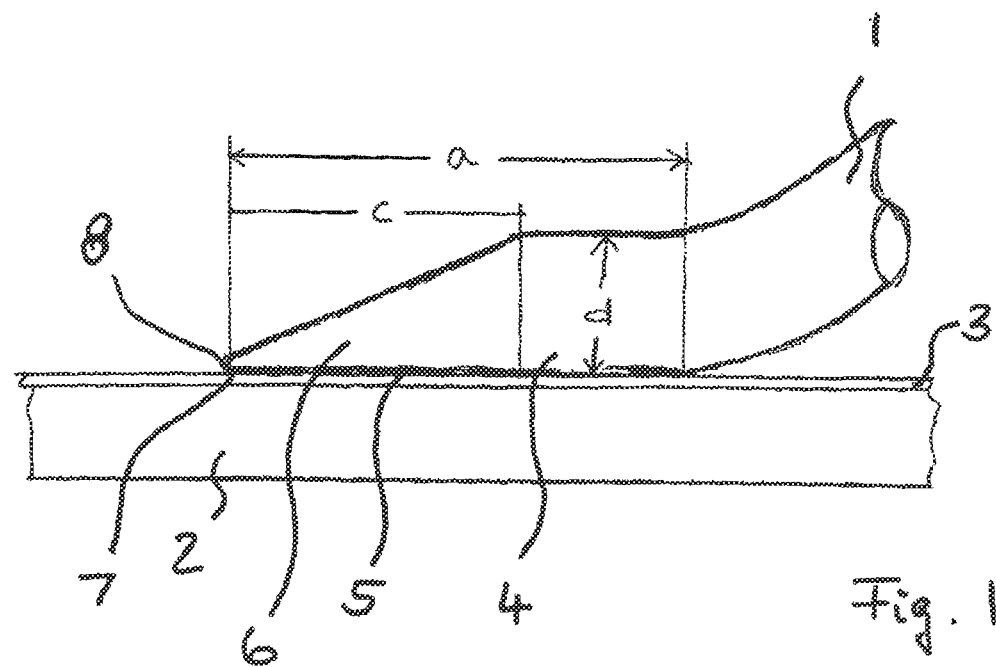
FIG. 1 a schematic illustration of a heavy-wire bond arrangement, in which an end bond section of a heavy wire is bonded to a substrate, and FIG. 2 a schematic illustration of a further heavy-wire bond arrangement, in which an end bond section of a heavy-wire is bonded to a substrate, wherein notches are formed at the end of the bond section.

FIG. 1 shows a schematic illustration of a heavy-wire bond arrangement having a heavy wire 1 and a substrate 2, which in the exemplary embodiment illustrated is a semiconductor substrate 3, for example, a silicon substrate, provided with a metallization. A bond section 4 of the heavy wire 1 with length a rests on the substrate 2. The heavy wire 1 has a wire cross-section (wire gauge) d, where d is approximately 100 μm to 500 μm. The bond section 4 is bonded to the substrate 2, so that a bond contact 5 (landing pad) is formed. The heavy wire 1 is a heavy wire made of aluminium, for example.

At the end of the bond section 4 a tapering section 6 with a length c is formed, in which in the embodiment shown the wire cross-section of the heavy wire 1 decreases continuously and evenly towards the end of the wire 7, wherein at the end of the wire 7 an end-face base section 8 is provided, which is elevated above the surface of the metallization 3. Not included in the tapered section is at least the surface region of the heavy wire 1, which is located in the area of the bond contact 5.

Figure 2:
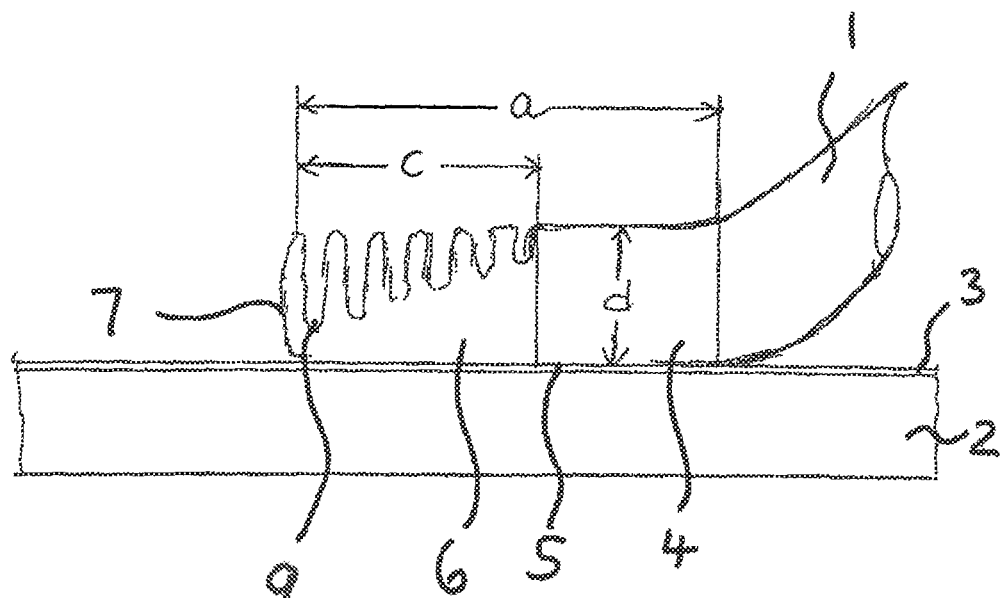

FIG. 2 shows a schematic illustration of a further heavy-wire bond arrangement. In FIG. 2 the same reference numerals as in FIG. 1 are used for equivalent features.

In the area of the tapering section 6, the heavy wire 1 in the further heavy-wire bond arrangement in accordance with FIG. 2 has notches 9, the depth of which increases continuously and evenly towards the end of the wire 7.

In the production of the heavy-wire bond arrangements shown in FIGS. 1 and 2, the formation of the geometric shape in the area of the tapering section 6 can be implemented before, after and/or during the heavy-wire bonding. It can thus also be provided that the taper is produced in part before the wire bonding, in order to post-process the tapered section after the wire bonding, or extend it further. This can be achieved using various machining methods such as grinding, laser processing or cutting.

The invention claimed is:

1. A heavy-wire bond arrangement, comprising:
   a substrate;
   a heavy wire; and
   a high-voltage heavy-wire bond connection, in which an end bond section of the heavy wire, which extends towards an end of the heavy wire is bonded to the substrate, such that in an area of the bond section, a bond contact between the heavy wire and the substrate is formed,
   wherein the heavy wire has a tapering section, which is adjoined to the wire end and in which a cross-section of the wire tapers towards the wire end, the tapering section extending in the bond section of the heavy wire as far as the wire end;
   wherein the tapering section starts in an area of full material thickness of the heavy wire, and includes a plurality of notches, the plurality of notches being separated from each other by a material of the heavy wire.

2. The heavy-wire bond arrangement according to claim 1, wherein the bond contact between the heavy wire and the substrate is continuous in the area of the bond section.

3. The heavy-wire bond arrangement according to claim 1, wherein in the tapering section the cross-section of the wire tapers on at least two sides.

4. The heavy-wire bond arrangement according to claim 1, wherein the tapering section is designed with an essentially level side surface, decreasing from one side of the heavy wire.

5. The heavy-wire bond arrangement according to claim 1, wherein at the end of the wire, the tapering section tapers to a residual end-face base section.

6. The heavy-wire bond arrangement according to claim 1, wherein at the wire end the tapering section extends over a range of approximately 60% to 70% of the length of the bond section.

7. The heavy-wire bond arrangement according to claim 1, wherein the bond section extends over a length which corresponds to a value of approximately 10% to 20% of the thickness of the heavy wire.

8. A method for producing a heavy-wire bond arrangement comprising:
providing a substrate;
providing a heavy wire; and
forming a high-voltage heavy-wire bond connection, by bonding an end bond section of the heavy wire, which extends towards an end of the heavy wire, to the substrate, such that in an area of the bond section, a bond contact between the heavy wire and the substrate is formed,
wherein the heavy wire is formed with a tapering section, which adjoins the end of the wire and in which a diameter of the wire tapers towards the end of the wire;
wherein the tapering section starts in an area of full material thickness of the heavy wire, and includes a plurality of notches, the plurality of notches being separated from each other by a material of the heavy wire.

9. The method according to claim 8, wherein the tapering section is formed before the bond section is bonded to the substrate.

10. The method according to claim 8, wherein the tapering section is formed in the process of bonding the bond section to the substrate.

11. The heavy-wire bond arrangement according to claim 1, wherein the wire cross section tapers continuously from the beginning of the tapering section towards the end of the heavy wire.

12. The heavy-wire bond arrangement according to claim 1, wherein a taper towards the end of the heavy wire is constant.

13. The heavy-wire bond arrangement according to claim 1, wherein a depth of the plurality of notches of the tapering section increases continuously and evenly towards the wire end.

14. The heavy-wire bond arrangement according to claim 1, wherein the material of the heavy wire between the plurality of notches protrudes from the tapering section a distance substantially equal to the full material thickness.

\* \* \* \* \*

UNITED STATES PATENT AND TRADEMARK OFFICE
CERTIFICATE OF CORRECTION

PATENT NO. : 9,992,861 B2  
APPLICATION NO. : 13/878787  
DATED : June 5, 2018  
INVENTOR(S) : Andreas Middendorf Page 1 of 1

It is certified that error appears in the above-identified patent and that said Letters Patent is hereby corrected as shown below:

On the Title Page

Other Publications, Column 1, (22), please change "Aug. 7, 2011" to --Sept. 7, 2011--

Signed and Sealed this  
Twenty-sixth Day of March, 2019

Andrei Iancu  
*Director of the United States Patent and Trademark Office*